(12) United States Patent
Amarloo et al.

(10) Patent No.: US 11,054,453 B2
(45) Date of Patent: Jul. 6, 2021

(54) PHOTONIC-CRYSTAL VAPOR CELLS FOR IMAGING OF ELECTROMAGNETIC FIELDS

(71) Applicant: Quantum Valley Ideas Laboratories, Waterloo (CA)

(72) Inventors: Hadi Amarloo, Waterloo (CA); Jaime Ramirez-Serrano, Waterloo (CA); James P. Shaffer, Kitchener (CA)

(73) Assignee: Quantum Valley Ideas Laboratories, Waterloo (CA)

( * ) Notice: Subject to any disclaimer, the term of this patent is extended or adjusted under 35 U.S.C. 154(b) by 0 days.

(21) Appl. No.: 16/996,663

(22) Filed: Aug. 18, 2020

(65) Prior Publication Data

US 2021/0156898 A1    May 27, 2021

Related U.S. Application Data

(60) Provisional application No. 62/941,591, filed on Nov. 27, 2019.

(51) Int. Cl.
*G01R 29/08* (2006.01)

(52) U.S. Cl.
CPC ..... *G01R 29/0821* (2013.01); *G01R 29/0878* (2013.01); *G01R 29/0892* (2013.01)

(58) Field of Classification Search
None
See application file for complete search history.

(56) References Cited

U.S. PATENT DOCUMENTS

| | | | |
|---|---|---|---|
| 6,331,208 B1 | 12/2001 | Nishida et al. | |
| 7,471,866 B2 | 12/2008 | Dumais et al. | |
| 7,645,681 B2 | 1/2010 | Okada | |
| 7,859,350 B1 | 12/2010 | Schwindt et al. | |
| 8,588,557 B2 | 11/2013 | Schmidt et al. | |
| 8,796,927 B2 | 8/2014 | Meinhold | |
| 8,906,470 B2 | 12/2014 | Overstolz et al. | |
| 8,970,309 B2 | 3/2015 | Sato et al. | |
| 9,503,021 B2 | 11/2016 | Hayashi et al. | |

(Continued)

OTHER PUBLICATIONS

WIPO, International Search Report and Written Opinion dated Dec. 10, 2020, in PCT/CA2020/051271, 8 pgs.

(Continued)

*Primary Examiner* — Jermele M Hollington
*Assistant Examiner* — Suresh K Rajaputra
(74) *Attorney, Agent, or Firm* — Henry Patent Law Firm PLLC (57) ABSTRACT

In a general aspect, vapor cells are disclosed that include a dielectric body having a first surface and a second surface. The dielectric body includes a plurality of cavities extending from the first surface to the second surface and ordered periodically to define a photonic crystal structure in the dielectric body. Each cavity has a first opening defined by the first surface and a second opening defined by the second surface. The photonic crystal structure has a photonic band gap. The vapor cells additionally include a first optical window covering the first openings and having a surface bonded to the first surface of the dielectric body to form a seal around each of the first openings. A second optical window covers the second openings and has a surface bonded to the second surface of the dielectric body to form a seal around each of the second openings.

16 Claims, 6 Drawing Sheets

(56) References Cited

U.S. PATENT DOCUMENTS

| | | | |
|---|---|---|---|
| 10,024,929 | B2 | 7/2018 | Parsa et al. |
| 10,370,760 | B2 | 8/2019 | Jacobs et al. |
| 10,509,065 | B1 | 12/2019 | Shaffer |
| 10,605,840 | B1* | 3/2020 | Amarloo ............ G01N 21/0303 |
| 10,859,981 | B1 | 12/2020 | Ramirez-Serrano et al. |
| 2003/0079823 | A1 | 5/2003 | Sabia |
| 2005/0007118 | A1 | 1/2005 | Kitching et al. |
| 2008/0159679 | A1* | 7/2008 | Sigalas ................ B82Y 20/00 385/2 |
| 2008/0219615 | A1* | 9/2008 | Cunningham ........ B01L 3/5085 385/12 |
| 2008/0252890 | A1* | 10/2008 | Noda ................ G01N 21/3504 356/436 |
| 2009/0256638 | A1 | 10/2009 | Rosenbluh et al. |
| 2012/0243088 | A1 | 9/2012 | Nagasaka |
| 2013/0270434 | A1 | 10/2013 | Nelson et al. |
| 2014/0160474 | A1* | 6/2014 | Keller ................ G01N 21/0303 356/246 |
| 2015/0192532 | A1 | 7/2015 | Clevenson et al. |
| 2016/0012930 | A1 | 1/2016 | Parsa et al. |
| 2016/0218726 | A1* | 7/2016 | Overstolz ................ H03L 7/26 |
| 2016/0363617 | A1 | 12/2016 | Anderson et al. |
| 2018/0212612 | A1 | 7/2018 | Park et al. |
| 2019/0187198 | A1 | 6/2019 | Anderson et al. |
| 2020/0333406 | A1 | 10/2020 | Gabrys et al. |

OTHER PUBLICATIONS

Subramonian, et al., "Micro-drilling of silicon wafer by industrial CO2 laser", International Journal of Mechanical and Materials Engineering, Feb. 26, 2015, 6 pgs.

USPTO, Notice of Allowance dated May 4, 2020, in U.S. Appl. No. 16/659,289, 10 pgs.

USPTO, Non-Final Office Action dated May 18, 2020, in U.S. Appl. No. 16/659,289, 12 pgs.

USPTO, Final Office Action dated Jun. 22, 2020, in U.S. Appl. No. 16/659,276, 13 pgs.

USPTO, Notice of Allowance dated Jul. 30, 2020, in U.S. Appl. No. 16/659,289, 13 pgs.

USPTO, Notice of Allowance dated Nov. 8, 2019, in U.S. Appl. No. 16/410,479, 14 pgs.

USPTO, Non-Final Office Action dated Apr. 30, 2020, in U.S. Appl. No. 16/659,276, 20 pgs.

USPTO, Non-Final Office Action dated Jan. 2, 2020, in U.S. Appl. No. 16/659,289, 26 pgs.

USPTO, Final Office Action dated Feb. 10, 2020, in U.S. Appl. No. 16/659,289, 29 pgs.

USPTO, Non-Final Office Action dated Jun. 24, 2019, in U.S. Appl. No. 16/410,479, 34 pgs.

https://cdn.rohde-schwarz.com/dk/seminars_workshops/BaseStationInstallationandAntennaTesting_2017_V1_Shared_DK.pdf retrieved Nov. 7, 2018, 40 pgs.

USPTO, Restriction Requirement dated Jan. 10, 2020, in U.S. Appl. No. 16/659,276, 6 pgs.

USPTO, Notice of Allowance dated Oct. 2, 2019, in U.S. Appl. No. 16/410,479, 9 pgs.

Wikipedia, "Hydroxide," retrieved from https://en.wikipedia.org/wiki/Hydroxide on Feb. 5, 2020, 2020, 7 pgs.

"Analyzing RFoCPRI(TM) at Fiber-Based Cell Sites", https://www.viavisolutions.com/en-us/literature/analyzing-rfocpri-fiber-based-cell-sites-application-notes-en.pdf retrieved Nov. 7, 2018, 2 pgs.

"Drone Cell Tower Inspection, Survey, Thermal Imaging and LIDAR", https://abjdrones.com/drone-cell-tower-inspection-services retrieved Nov. 7, 2018, 6 pgs.

"InUAVI: Developing advanced electronic sensors and payloads for USV's and Aerospace", http://inuavi.io retrieved Nov. 7, 2018, 5 pgs.

Amarloo, et al., "A Vapor Cell for Electromagnetic Imaging Using Rydberg Atom-based Electrometry", Aug. 9, 2019, 6 pgs.

Anderson, et al., "A self-calibrating SI-traceable broadband Rydberg atom-based radio-frequency electric field probe and measurement instrument", arXiv:1910.07107v2 [physics.atom-ph], Oct. 18, 2019, 12 pgs.

Chutani, "Design, Technology and Packaging of Cesium Vapor Cells for MEMS Atomic Clocks", Dissertation, Engineering Sciences, Université de Franche-Comté, 2011, 37 pgs.

Fan, et al., "Atom based RF electric field sensing", Journal of Physics B: Atomic, Molecular and Optical Physics, Sep. 9, 2015, 17 pgs.

Fan, et al., "Dispersive radio frequency electrometry using Rydberg atoms in a prism-shaped atomic vapor cell", J. Phys. B: At. Mol. Opt. Phys. 49, 2016, 8 pgs.

Fan, et al., "Effect of Vapor-Cell Geometry on Rydberg-Atom-Based Measurements of Radio-Frequency Electric Fields", Physical Review Applied 4, 044015, 2015, 7 pgs.

Fan, et al., "Subwavelength microwave electric-field imaging using Rydberg atoms inside atomic vapor cells", Optics Letters, vol. 39, No. 10, May 15, 2014, 4 pgs.

Goodman, "Introduction to Fourier Optics", McGraw-Hill Companies, Inc., 1968, 457 pgs.

Gosele, et al., "Wafer bonding for microsystems technologies", Sensors and Actuators 74, 161-168, 1999, 8 pgs.

Holloway, et al., "Atom-Based RF Electric Field Measurements: An Initial Investigation of the Measurement Uncertainties", IEEE International Symposium on Electromagnetic Compatibility, 2015, 6 pgs.

Karlen, "Fabrication and Characterization of MEMS alkali vapor cells used in chip-scale atomic clocks and other atomic devices", Dissertation, Univ. of Neuchâtel, 2018, 156 pgs.

Knapkiewicz, "Technological Assessment of MEMS Alkali Vapor Cells for Atomic References", micromachines, 10,25, Dec. 31, 2018, 20 pgs.

Kumar, et al., "Atom-Based Sensing of Weak Radio Frequency Electric Fields Using Homodyne Readout", Scientific Reports 7:42981, Feb. 20, 2017, 10 pgs.

Kumar, et al., "Rydberg-atom based radio-frequency electrometry using frequency modulation spectroscopy in room temperature vapor cells", Optics Express, vol. 25, No. 8, Apr. 17, 2017, 13 pgs.

Masteika, et al., "A Review of Hydrophilic Silicon Wafer Bonding", ECS Journal of Solid State Science and Technology, 3 (4) Q42-Q54, 2014, 13 pgs.

Nie, et al., "Pressure Aided Low Temperature Direct Bonding of Silicon Wafers with High Surface Roughness", 2006 1st IEEE Intl Conf on Nano/Micro Engineered and Molecular Systems, Jan. 18, 2006, 5 pgs.

Qin, et al., "Low-Temperature Bonding for Silicon-Based Micro-Optical Systems", Photonics, vol. 2, No. 4, Multidisciplinary Digital Publishing Institute, Dec. 15, 2015, 38 pgs.

Schnars, "Direct phase determination in hologram interferometry with use of digitally recorded holograms", J.Opt.Soc.Am.A, vol. 11, No. 7, Jul. 1994, 5 pgs.

Sedlacek, et al., "Atom-Based Vector Microwave Electrometry Using Ribidium Rydberg Atoms in a Vapor Cell", Physical Review Letters, Aug. 6, 2013, 5 pgs.

Sedlacek, et al., "Microwave electrometry with Rydberg atoms in a vapour cell using bright atomic resonances", Nature Physics, Sep. 16, 2012, 6 pgs.

Sedlacek, et al., "Quantum Assisted Electrometry using Bright Atomic Resonances", arXiv:1205.4461v1 [physics.atom-ph], May 20, 2012, 15 pgs.

Shaffer, et al., "A read-out enhancement for microwave electric field sensing with Rydberg atoms", SPIE Photonics Europe, 2018, Strasbourg, France, 2018, 11 pgs.

Suni, et al., "Effects of Plasma Activation on Hydrophilic Bonding of Si and SiO2", Journal of the Electrochemical Society, 149 (6) G348-G351, 2002, 4 pgs.

Tong, et al., "Low Temperature Wafer Direct Bonding", Journal of Microelectromechanical Systems, vol. 3, No. 1, Mar. 1994, 7 pgs.

Vrijsen, "Collective Quantum Behavior of Atomic Ensembles in High-Finesse Optical Cavities", Dissertation, Stanford University., Dec. 2011, 112 pgs.

(56) References Cited

OTHER PUBLICATIONS

Ye, et al., "Molecular Iodine Clock", Physical Review Letters 87, 27, 270801, Dec. 31, 2001, 4 pgs.
USPTO, Notice of Allowance dated Nov. 20, 2020, in U.S. Appl. No. 16/996,652, 18 pgs.
WIPO, International Search Report and Written Opinion dated Dec. 22, 2020, in PCT/CA2020/051269, 9 pgs.
Noda, "Photonic Crystals", Comprehensive Microsystems, 2008, 12 pgs.
Sievenpiper, et al., "Two-dimensional photonic-crystal vertical-cavity array for nonlinear optical image processing", Applied optics 37.11, Apr. 10, 2998, 5 pgs.
Vignolini, et al., "Near-field imaging of coupled photonic-crystal microcavities", Applied Physics letters 94.15, Apr. 14, 2009, 4 pgs.
USPTO; Non-Final Office Action dated Feb. 1, 2021, in U.S. Appl. No. 16/996,652, 14 pgs.

\* cited by examiner

PHOTONIC-CRYSTAL VAPOR CELLS FOR IMAGING OF ELECTROMAGNETIC FIELDS

CROSS-REFERENCE TO RELATED APPLICATIONS

This application claims priority to U.S. Provisional Application No. 62/941,591 filed Nov. 27, 2019, and entitled, "Photonic-Crystal Vapor Cells for Imaging of Electromagnetic Fields," the disclosure of which is hereby incorporated by reference.

BACKGROUND

The following description relates to photonic-crystal vapor cells for imaging of electromagnetic fields.

Over-the-air (OTA) testing is important for many systems that utilize electromagnetic radiation for obtaining and communicating information (e.g., radar systems, medical imaging systems, cellular systems, etc.). Moreover, the testing of such systems during their design, manufacturing, and deployment is also important to ensure regulatory compliance. The challenges of such testing increase as the electromagnetic frequencies utilized by the systems scale to higher frequencies (e.g., greater than 30 GHz) and as integration between multiple components in the systems becomes more tightly knit. An example of system integration in high-frequency electronics is the merging of antennas with transceiver systems and amplifiers. Testing of such highly-integrated and sophisticated systems, particularly in the mm-wave regime, is widely recognized as a looming problem for the automotive and transportation, radar and telecommunications industries.

DETAILED DESCRIPTION

In a general aspect, vapor cells are disclosed for imaging electromagnetic radiation, including methods for manufacturing such vapor cells. The vapor cells include a photonic crystal frame that includes a plurality of cavities defining a periodic arrangement. The periodic arrangement may include defects. The plurality of cavities may be disposed along a two-dimensional lattice to define the periodic arrangement. In many variations, each of the plurality of periodic cavities is identical in configuration (e.g., identical shape, size, etc.). However, in other variations, the plurality of cavities includes sub-groups of cavities, each of which, has cavities of identical configuration. The sub-groups of cavities may be arranged on respective sub-lattices of the two-dimensional lattice to define the periodic arrangement. The methods of manufacturing may allow the fabrication of a thin vapor cell with a photonic crystal frame that can be used to image electromagnetic fields using Rydberg atom electrometry. The phase resolution across the vapor cell is set by its thickness in comparison to the wavelength of the target radiation field and the spatial resolution of the optical fields used to prepare the atoms and readout their response.

The vapor cell may be fabricated by creating the photonic crystal frame and then bonding an optical window with a dielectric mirror to the frame (e.g., a Bragg reflector) that can reflect the optical fields or signals (e.g., laser beams) used to prepare the atoms and read them out. However, in some variations, the dielectric mirror is absent and the vapor cell is configured to be used in transmission. A first optical window is bonded onto the photonic crystal frame, which may be a top optical window. The first optical window may include a dielectric mirror. The dielectric mirror may be configured to be thin. In some instances, the dielectric mirror may be deposited on a surface of the first optical window. In other instances, the dielectric mirror is attached to a surface of the first optical window (e.g., via adhesive or glue).

Low temperature contact bonding can be used to seal a second optical window (e.g., a bottom optical window) to the vapor cell so that the atomic sample remains pure. However, other types of bonding (e.g., anodic bonding, frit bonding, etc.) may also be used. The photonic crystal frame can prevent the optical windows from warping under atmospheric pressure so that imaging of the light from the cavities of the photonic crystal frame, filled with an atomic or molecular vapor, can allow imaging of the incident electromagnetic fields with high spatial resolution. For example, cross-talk between different areas along the surface of the vapor cell are minimized, thereby improving spatial resolution. In some variations, the photonic crystal frame is designed to have a band gap for either or both transverse magnetic (TM) and transverse electric (TE) radiation with respect to the direction normal to the surface of the photonic crystal for a specific target field frequency range in the plane of the vapor cell. This design can prevent reflections from interfering with the measurement. In some variations, the plurality of cavities (or defects) are designed on the surface to amplify an electromagnetic field at specific points along the surface. In many variations, the plurality of cavities are fluidly-coupled by passages (e.g., gaps, channels, notches, etc.) so that the vapor inside the vapor cell, e.g. a vapor of alkali atoms, can be uniformly distributed throughout the vapor cell. The passages may be formed into the walls of the photonic crystal frame that define the plurality of cavities.

The vapor cells can also be used for vapor cell magnetometry. For example, in cases where the sealing bond takes place at about room temperature, anti-spin relaxation coatings, such as paraffin, can be applied to the vapor cells to increase the integration times for the spin. The vapor cells can be optically coupled through free space or by waveguides such as optical fiber bundles. The vapor cell may be configured for accurately measuring the amplitude and phase of electromagnetic fields, and in some instances, also image the amplitude and phase of the electromagnetic fields.

The use of Rydberg atoms for electrometry has led to accurate, absolute measurements of high frequency electric fields (HFE). There are a number of antenna measurement applications for which this technology holds considerable promise for advancing the state-of-the-art. However, there are challenges at certain ranges of antenna size (both small and large) as well at high power. These challenges may be mitigated by a more electromagnetically transparent and conductor-free HFE probe than anything that is used today. The use of a dielectric probe can drive down the achievable error floor in these measurements while providing a means to drastically reduce costs, therefore opening new application spaces. Over the air (OTA) testing of high frequency electronics is becoming more and more important as the integration of these devices increases, making them extremely difficult to test using traditional methods. By almost completely removing undesirable materials from the probe, the measurement of exceptionally high accuracy can be achieved which is important for determining the electromagnetic fields emitted from a device under test (DUT). The technology presented in this disclosure allows the construction and operation of a vapor cell, electric field imaging device, for example, a CCD for HFE. Using atom-based electric field sensing, the spatial and phase resolution that can be obtained can allow imaging of both phase and amplitude in a plane near to a DUT. The amplitude and phase information across the plane of the vapor cell sensor can be used to propagate the field to another location using well-known routines such as those based on Fresnel theory.

Accurate measurements of antenna radiation patterns are often required for validating the engineering science of antenna design as well as ensuring that antennas operate as intended in their given application. Electromagnetic radiation from other types of devices are also important to test, e.g., EMI from other HFE devices such as amplifiers. State-of-the-art approaches to antenna pattern measurement usually rely on a field probe that is a conducting antenna, with both the probe and antenna under test (AUT) surrounded by a large anechoic chamber. These chambers are typically large, sealed metallic boxes that are coated internally with foam that absorbs all radiation. Metal cables must be run to and from the AUT and probe to make even the most basic measurements. Metal structures in the positioning equipment provide additional complexity to the environment and are sources of error.

With the more flexible Rydberg atom-based technology, the size of the anechoic chambers can be more readily tailored to individual applications, easing the chamber cost-to-performance significantly. For electrically small antennas—those whose dimensions are small relative to their operating wavelength—the presence of excess metal structures compounds the difficult challenge of ensuring adequate absorption of their radiation at all but the desired directions. For pattern measurements of power only, the Rydberg atom electrometer does not require synchronization between the antenna and probe; allowing the AUT to be fed by an integrated oscillator, removing the need for cables altogether.

In some implementations, the vapor cells described herein allow a multiple field point imaging device for imaging the amplitude and phase of an electromagnetic field produced by a high frequency electronic device, like an antenna. Such an imaging device could be lightweight and portable allowing very accurate calibrations of antennas in the field or on assembly lines. Such characterization could be invaluable for many applications in communications, automotive radar, electronics, weather radar and military radar. Imaging devices based on the vapor cells described herein are suitable for imaging electromagnetic fields emanating from a DUT for over the air testing (OTA). OTA is important because it allows a noninvasive and non-destructive method to test a DUT. In some implementations, the vapor cells allow the following advantages: [1] dielectric in nature, [2] thinness (giving the phase resolution), [3] structural integrity, [4] broad area for intercepting electromagnetic fields, [5] uniformity of response, [6] reflective backing for imaging the optical read-out fields, [7] use of a photonic band-gap to minimize reflections, [8] the use of photonic crystalline structures to amplify the electromagnetic field at specific points on a vapor cell, and [9] the ability to manufacture the vapor cells on industrial scale, in different sizes and for different frequencies of electromagnetic radiation. Other advantages are possible. The integration of these characteristics into a single vapor cell may allow the vapor cell to be used for electric field imaging using atom-based electric field sensing.

Figure 1A:
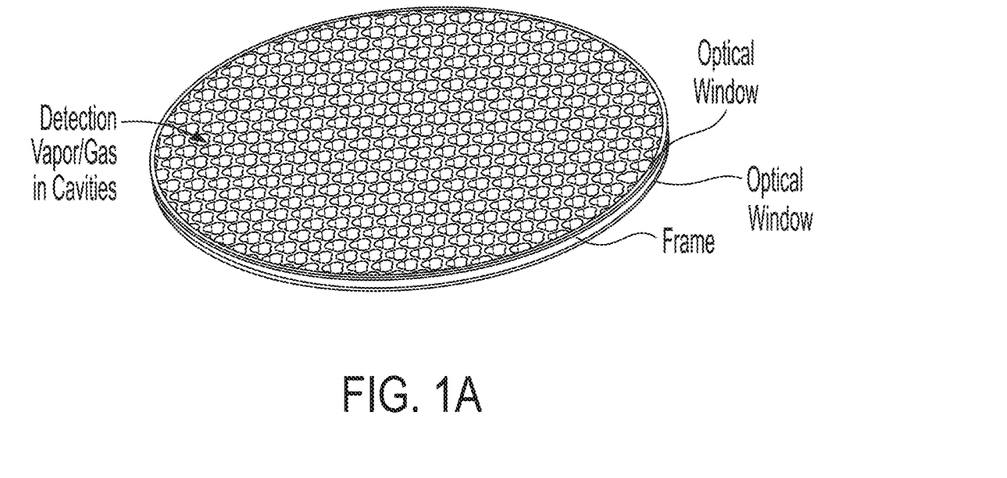
FIG. 1A is a schematic diagram of an example vapor cell that includes a frame with cavities defining a photonic crystal structure.
Figure 1B:
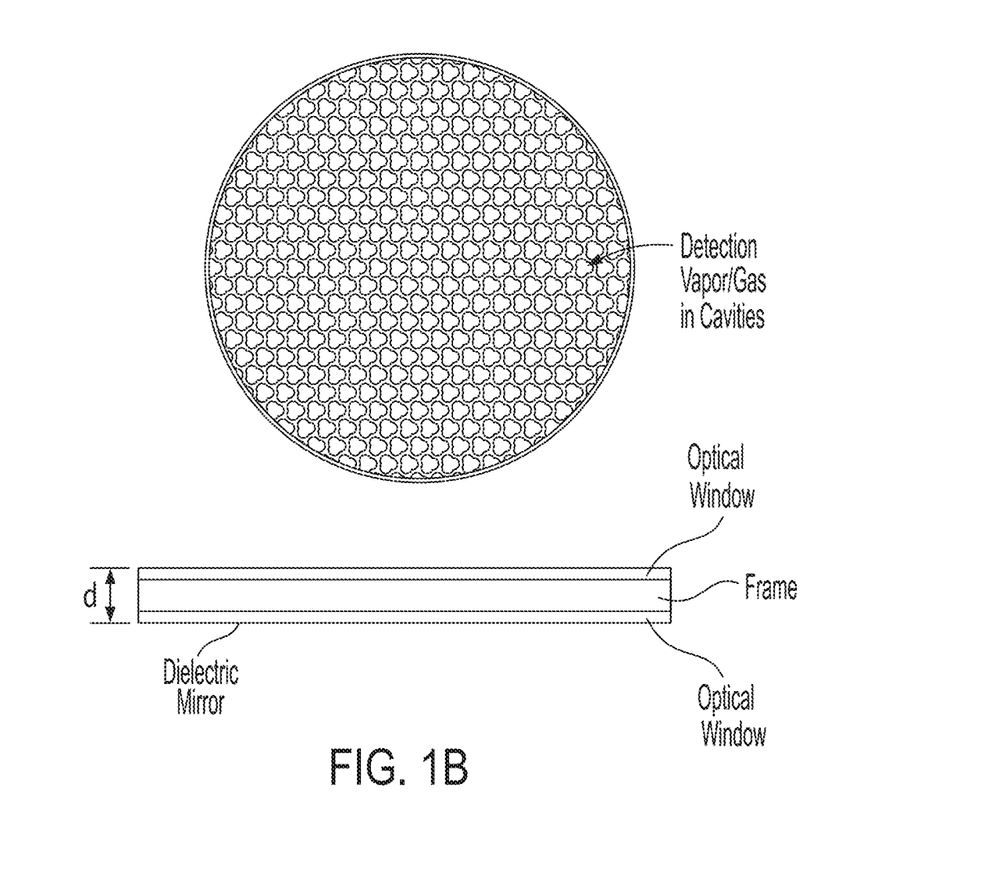
FIG. 1B presents a top view and a partial side view of the example vapor cell of FIG. 1A.

FIG. 1A shows a schematic diagram of an example vapor cell that includes a frame with cavities defining a photonic crystal structure. FIG. 1B presents a top view and a partial side view of the example vapor cell of FIG. 1A. The example vapor cell also includes two optical windows bonded to the frame. The frame, which corresponds to a dielectric body, is disposed between the two optical windows. The frame may be laser cut, etched, or machined (or any combination thereof) to form cavities in the dielectric body, which may be formed of silicon or glass. However, other dielectric materials are possible (e.g., sapphire). The frame includes connecting walls that partition an internal volume of the frame into a plurality of cavities. The cavities may be uniform in size and shape and may be disposed within the frame according to a periodic arrangement. In particular, the cavities may be arranged periodically within the frame to define the photonic crystal structure. A vapor or gas (or source thereof) for detecting a target radiation resides in the cavities. Features of the photonic crystal structure will be described further in relation to FIGS. 2A-2D and 3A-3C.

Laser cutting makes the manufacture of the example vapor cell more amenable to mass production. In many variations, the optical window on one side of the vapor cell (bottom) includes a multilayer Bragg reflector (or dielectric mirror) optimized for reflection of one or more of the optical signals (or beams of light) used to initialize and readout of the atoms in the vapor cell. The Bragg reflector may be made of alternating layers of $SiO_2$ and $TiO_2$. However, other variations are possible. In some variations, the last layer of the Bragg reflector is formed of $SiO_2$. In other variations, the last layer of the Bragg reflector is formed of $TiO_2$. Selection of the last layer may be made to facilitate contact bonding of the Bragg reflector to the frame.

If the Bragg reflector is not made of $SiO_2$ but another material, it is still possible to place an $SiO_2$ adhesion layer onto the surface of the Bragg reflector. The $SiO_2$ adhesion layer may define or include a contact-bondable surface. Other materials are also possible. For example, a $TiO_2$ adhesion layer may be placed onto the surface of the Bragg reflector. This layer may define or include a contact-bondable surface. The reflector can be dielectric and thin in order to reduce scattering of the incident field that is targeted for measurement. The top optical window is affixed to the frame using a bonding technique that can utilize high temperatures and/or high voltages such as anodic or glass frit bonding. If the frame is made of glass, a thin layer of Si can be deposited on the frame material as an adhesion layer for anodic bonding. It is also possible to contact bond the optical window to the frame when both are formed from glass.

Figure 2A:
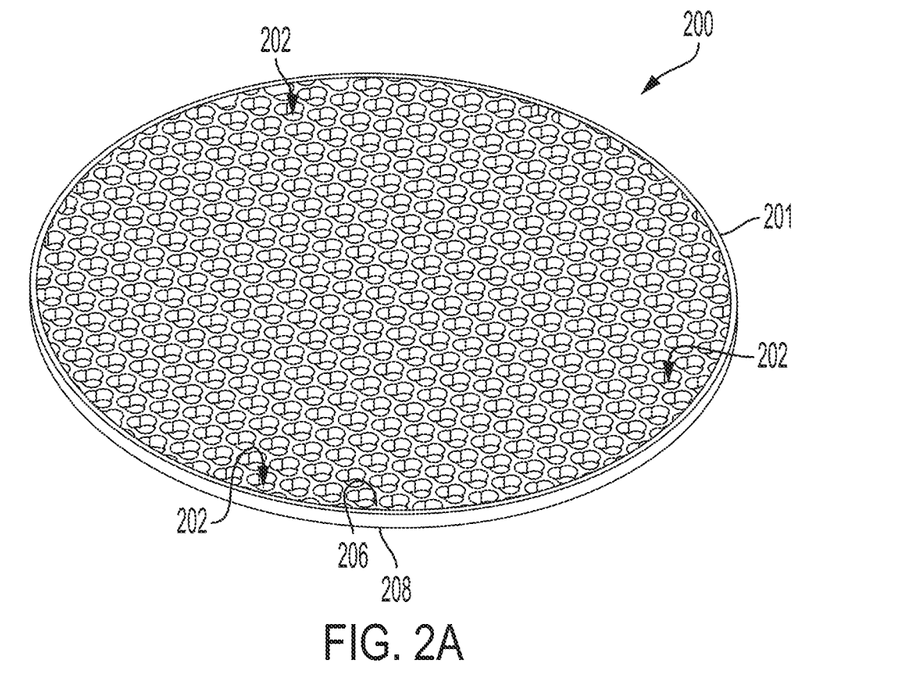
FIG. 2A is a schematic diagram of an example photonic crystal frame of a vapor cell that includes a plurality of cavities.
Figure 2B:
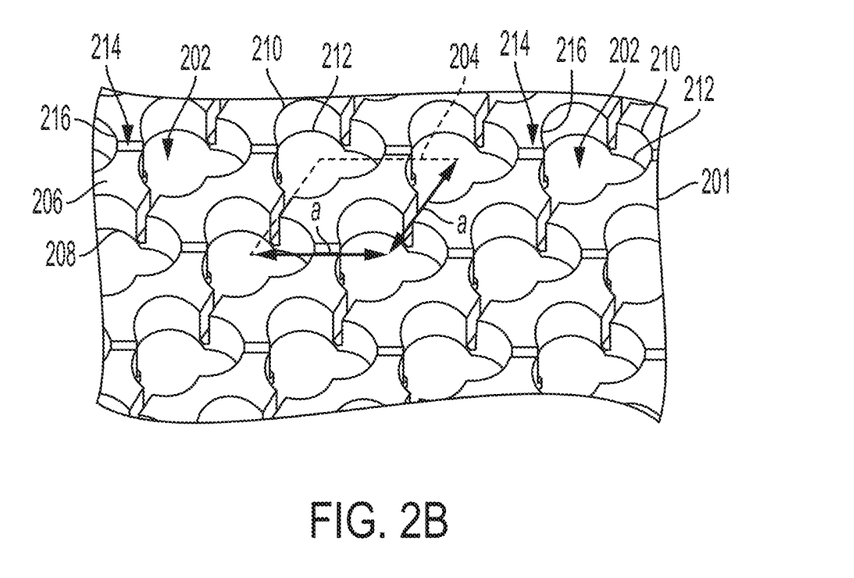
FIG. 2B is an enlarged view of a portion of the example photonic crystal frame of FIG. 2A showing a unit cell that defines a two-dimensional lattice of the example photonic crystal frame.

Now referring to FIGS. 2A-2B, a schematic diagram is presented of an example photonic crystal frame (or dielectric body) 200 of a vapor cell that includes a plurality of cavities 202. FIG. 2B presents an enlarged view of a portion of the example photonic crystal frame 200 of FIG. 2A showing a unit cell 204 that defines a two-dimensional lattice of the example photonic crystal frame 200. The example photonic crystal frame 200 is analogous to the frame described in relation to FIGS. 1A-1B. The plurality of cavities 202 is disposed along a two-dimensional lattice to define a periodic arrangement. The periodic arrangement may, in some variations, include defects (e.g., larger cavities at some points on the frame). In FIGS. 2A-2B, the example two-dimensional lattice is defined by a rhombohedral unit cell 204 of dimension, a (or lattice constant, a). However, other types of unit cells are possible (e.g., square, rectangular, hexagonal, triangular, etc.). The periodic arrangement allows the plurality of cavities 202 to be organized into a pattern that induces a photonic band gap. The photonic band gap may be applicable to one or both of the TE and TM modes of the electromagnetic field for modes propagating in the structure parallel to the surface. The lattice constant, a, can be chosen based on the frequency range of interest. For example, for a triangular lattice in silicon, the frequency range of the photonic band gap may be approximately from $0.25c/a$ to $0.33c/a$ where c is the speed of light in vacuum. Adjacent cavities are fluidly connected by slots or grooves that allow the example photonic crystal frame to maintain a uniform vapor pressure across the vapor cell.

The example photonic crystal frame may be part of a vapor cell. For example, in many implementations a vapor cell includes a dielectric body 201 defining the photonic crystal frame 200. The dielectric body 201 has a first surface 206 and a second surface 208 disposed opposite the first surface 206. In some instances, the first and second surfaces 206, 208 are planar. In some instances, the first and second surfaces 206, 208 are parallel to each other. In the example shown, a plurality of cavities extends from the first surface 206 to the second surface 208 and is ordered periodically to define a photonic crystal structure in the dielectric body 201. Each of the cavities 202 has a first opening 210 defined by the first surface 206 and a second opening 212 defined by the second surface 208. The photonic crystal structure has a photonic band gap. In some variations, the photonic band gap includes a band gap associated with a transverse magnetic (TM) mode of electromagnetic radiation. In some variations, the photonic band gap includes a band gap associated with a transverse electric (TE) mode of electromagnetic radiation. However, depending on a configuration of the photonic crystal structure, other types of band gaps may be possible.

The dielectric body 201 may be formed of a material transparent to electric fields (or electromagnetic radiation) measured by the vapor cell. The material may be an insulating material having a high resistivity, e.g., $\rho>10^3$ $\Omega\cdot$cm, and may also correspond to a single crystal, a polycrystalline ceramic, or an amorphous glass. For example, the dielectric body 201 may be formed of silicon. In another example, the dielectric body 201 may be formed of a glass that includes silicon oxide (e.g., $SiO_2$, $SiO_x$, etc.), such as vitreous silica, a borosilicate glass, or an aluminosilicate glass. In some instances, the material of the dielectric body 201 is an oxide material such as magnesium oxide (e.g., MgO), aluminum oxide (e.g., $Al_2O_3$), silicon dioxide (e.g., $SiO_2$), titanium dioxide (e.g., $TiO_2$), zirconium dioxide, (e.g., $ZrO_2$), yttrium oxide (e.g., $Y_2O_3$), lanthanum oxide (e.g., $La_2O_3$), and so forth. The oxide material may be non-stoichiometric (e.g., $SiO_x$), and may also be a combination of one or more binary oxides (e.g., $Y:ZrO_2$, $LaAlO_3$, etc.). In other instances, the material of the dielectric body 201 is a non-oxide material such as silicon (Si), diamond (C), gallium nitride (GaN), calcium fluoride (CaF), and so forth.

The vapor cell may include a first optical window and a second optical window, such as described in relation to FIGS. 1A-1B. The first optical window covers the first openings 210 and has a surface bonded to the first surface 206 of the dielectric body 201 to form a seal around each of the first openings 210. The second optical window covers the second openings 212 and has a surface bonded to the second surface 208 of the dielectric body 201 to form a seal around each of the second openings 212. The first and second optical windows may thus enclose a vapor (or a source of the vapor) in the plurality of cavities 202. In some variations, the first optical window includes a dielectric mirror, such a Bragg reflector. The dielectric mirror may be disposed along the surface of the first optical window bonded to the first surface 206 of the dielectric body 201. In some variations, the second optical window includes an anti-reflection coating.

The first and second optical windows may be formed of a material transparent to electromagnetic radiation (e.g., laser light) used to probe a vapor sealed within the plurality of cavities 202 of the dielectric body 201. For example, the material of the first and second optical windows may be transparent to infrared wavelengths of electromagnetic radiation (e.g., 700-5000 nm), visible wavelengths of electromagnetic radiation (e.g., 400-700 nm), or ultraviolet wavelengths of electromagnetic radiation (e.g., 10-400 nm). Moreover, the material of the first and second optical windows may be an insulating material having a high resistivity, e.g., $\rho>10^3$ $\Omega\cdot$cm, and may also correspond to a single crystal, a polycrystalline ceramic, or an amorphous glass. For example, the material of the first and second optical windows may include silicon oxide (e.g., $SiO_2$, $SiO_x$, etc.), such as found within quartz, vitreous silica, or a borosilicate glass. In another example, the material of the first and second optical windows may include aluminum oxide (e.g., $Al_2O_3$, $Al_xO_y$, etc.), such as found in sapphire or an aluminosilicate glass. In some instances, the material of the first and second optical windows is an oxide material such as magnesium oxide (e.g., MgO), aluminum oxide (e.g., $Al_2O_3$), silicon dioxide (e.g., $SiO_2$), titanium dioxide (e.g., $TiO_2$), zirconium dioxide, (e.g., $ZrO_2$), yttrium oxide (e.g., $Y_2O_3$), lanthanum oxide (e.g., $La_2O_3$), and so forth. The oxide material may be non-stoichiometric (e.g., $SiO_x$), and may also be a combination of one or more binary oxides (e.g., $Y:ZrO_2$, $LaAlO_3$, etc.). In other instances, the material of the first and second optical windows is a non-oxide material such as diamond (C), calcium fluoride (CaF), and so forth.

Figure 2C:
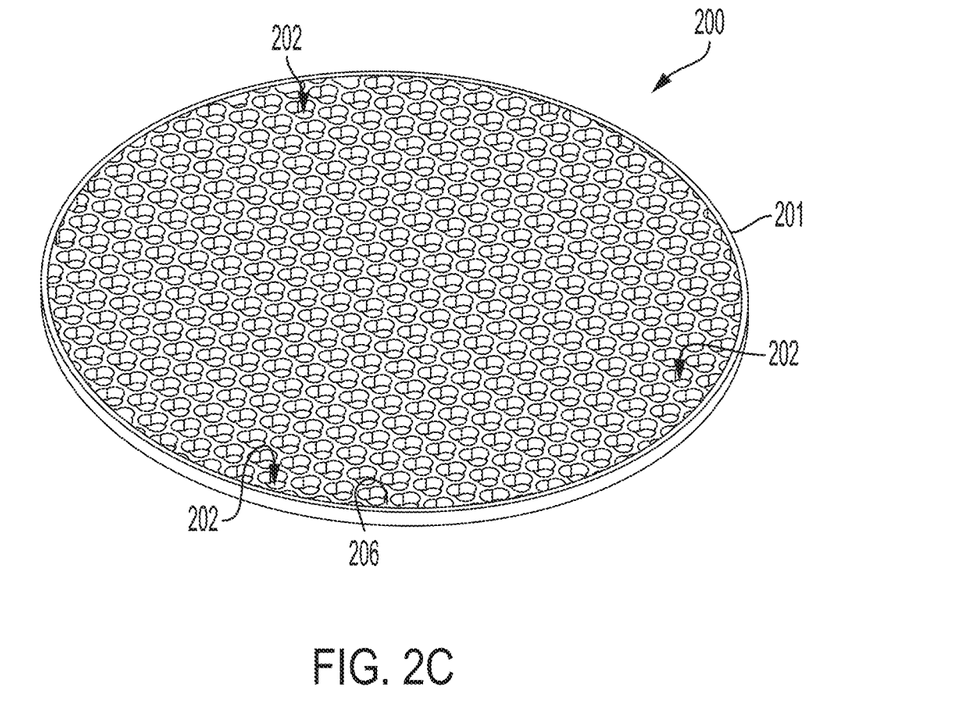
FIG. 2C is a schematic diagram of the example photonic crystal frame of FIG. 2A, but in which a portion serves as an optical window.
Figure 2D:
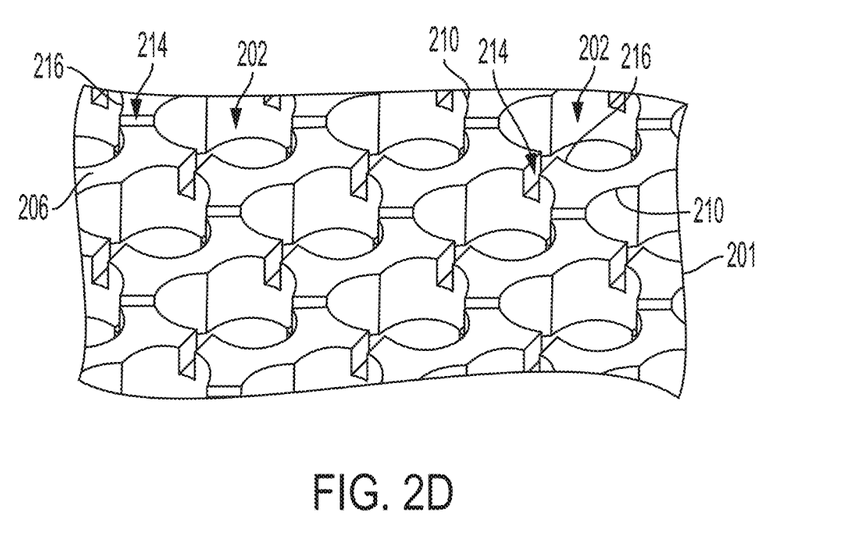
FIG. 2D is an enlarged view of a portion of the example photonic crystal frame of FIG. 2C.

In some implementations, one of the first and second optical windows is integral to the dielectric body 201. In these implementations, a portion of the dielectric body 201 serves as an optical window. For example, FIG. 2C presents a schematic diagram of the dielectric body 201 of FIG. 2A, but in which a portion of the dielectric body 201 serves as the second optical window. FIG. 2D presents an enlarged view of a portion of the example photonic crystal frame of FIG. 2C. In FIG. 2C, the plurality of cavities 202 extends from the first surface 206 partially through the dielectric body 201. When the vapor cell is assembled, the first optical window will then enclose each cavity 202 when forming a seal around their respective first openings 210. To manufacture the dielectric body 201 of FIG. 2C, a patterned layer may be applied to the first surface 206 of the dielectric body 201 that includes holes defining a shape of the plurality of cavities 202. Portions of the first surface 206 exposed through holes may then be contacted with a chemical etchant. Other methods of manufacture, however, are possible.

Now referring to FIGS. 2A-2D, the example vapor cell includes a vapor or a source of the vapor in each of the plurality of cavities 202. The vapor may include constituents such as a gas of alkali-metal atoms, a noble gas, a gas of diatomic halogen molecules, or a gas of organic molecules. For example, the vapor may include a gas of alkali-metal atoms (e.g., K, Rb, Cs, etc.), a noble gas (e.g., He, Ne, Ar, Kr, etc.), or both. In another example, the vapor may include a gas of diatomic halogen molecules (e.g., $F_2$, $Cl_2$, $Br_2$, etc.), a noble gas, or both. In yet another example, the vapor may include a gas of organic molecules (e.g., acetylene), a noble gas, or both. Other combinations for the vapor are possible, including other constituents. The source of the vapor may generate the vapor in response to an energetic stimulus, such as heat, exposure to ultraviolet radiation, and so forth. For example, the vapor may correspond to a gas of alkali-metal atoms and the source of the vapor may correspond to an alkali-metal mass sufficiently cooled to be in a solid or liquid phase when disposed into the plurality of cavities 202. In some implementations, the source of the vapor resides in one or more cavities 202 and includes a liquid or solid source of the alkali-metal atoms configured to generate a gas of the alkali-metal atoms when heated (e.g., an azide compound comprising the alkali metal atoms or a drop of Cs encased in paraffin).

In many implementations, a passage 214 (e.g., a channel, a groove, a notch, etc.) is disposed through each wall 216 separating the plurality of cavities 202 and fluidly couples adjacent cavities 202 separated by the wall 216. The passage 214 allows the vapor to flow between the plurality of cavities 202, and in doing so, may allow the vapor cell to maintain an equal distribution of vapor throughout the plurality of cavities 202 (e.g., an equal pressure between cells 216, an equal density of vapor in each cell 216, and so forth). During manufacture, the passages 214 collectively may allow the plurality of cavities 202 to be filled with vapor. Filling with vapor may occur by introducing the vapor through a fill hole in the dielectric body 201, a fill hole in one or both of the first and second optical windows, or some combination thereof. Such filling may also occur by stimulating, with energy (e.g., heat), a source of the vapor that has been disposed in one or more the plurality of cavities 202.

In many implementations, the dielectric body 201 corresponds to a thin body. In these implementations, the dielectric body 201 may have a height defined by a distance between the first and second surfaces 206, 208 and a width defined by a maximum dimension along a direction perpendicular to the height. In some variations, the height is no greater than 10 percent of the width. In some variations, the height is no greater than 8 percent of the width. In some variations, the height is no greater than 6 percent of the width. In some variations, the height is no greater than 4 percent of the width. In some variations, the height is no greater than 2 percent of the width. In some variations, the height is no greater than 1 percent of the width. In some variations, the height is no greater than 0.5 percent of the width.

In some implementations, the plurality of cavities in the dielectric body 201 is ordered according to a two-dimensional lattice. The two-dimensional lattice may include lattices sites that are equivalent. Alternatively, the two-dimensional lattice may include first lattice sites and second lattice sites. The first lattice sites may be associated with first cavities having an identical shape and size. The second lattice sites may be associated with defects of the photonic lattice. In some instances, the defects include a second cavity larger in size than the first cavities. In some instances, the defects include a second cavity smaller in size than the first cavities. In some instances, the defects may include a second cavity having a shape different than the first cavities. In some variations, the two-dimensional lattice includes three or more lattice sites, each associated with a distinct group of cavities or defects.

In some implementations, the vapor cell is configured to detect a target electromagnetic radiation. In certain of these implementations, each of the plurality of cavities 202 in the dielectric body 201 has a maximum dimension no greater than a wavelength of the target electromagnetic radiation. In certain of these implementations, the photonic band gap of the photonic crystal structure is no less than a bandwidth of the target electromagnetic radiation.

In some implementations, the vapor cell is configured to detect electromagnetic radiation within a target frequency range. The target frequency range is within or overlaps the photonic band gap. In some of these implementations, the photonic band gap includes a band gap associated with a transverse magnetic (TM) mode of the electromagnetic radiation. In some of these implementations, the photonic band gap includes a band gap associated with a transverse electric (TE) mode of the electromagnetic radiation. In some of these implementations, the photonic band gap includes a band gap associated with both a transverse magnetic (TM) mode and a transverse electric (TE) mode of the electromagnetic radiation. In many instances, the transverse electric (TE) and transverse magnetic (TM) modes are mixtures (e.g., a mixed mode). In these instances, the terms "transverse electric (TE)" and "transverse magnetic (TM)" may refer to the dominant character of the mixture or mixed mode.

Figure 3A:
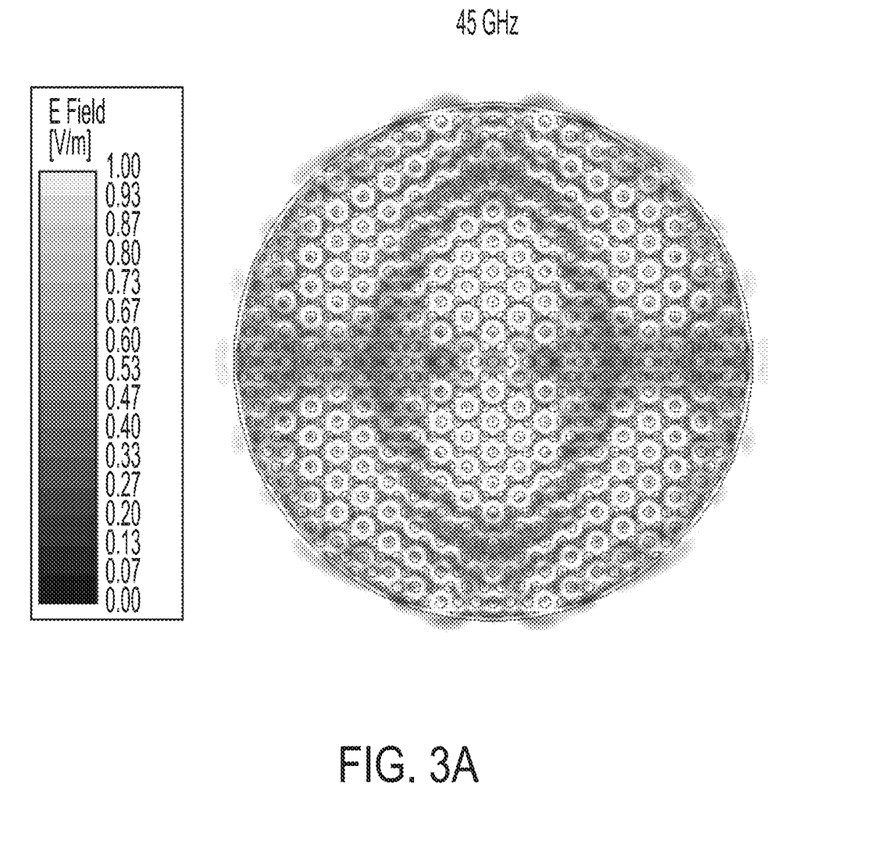
FIG. 3A is a contour graph of an electromagnetic field pattern in an example vapor cell after illumination with a plane wave of electromagnetic radiation at 45 GHz.
Figure 3B:
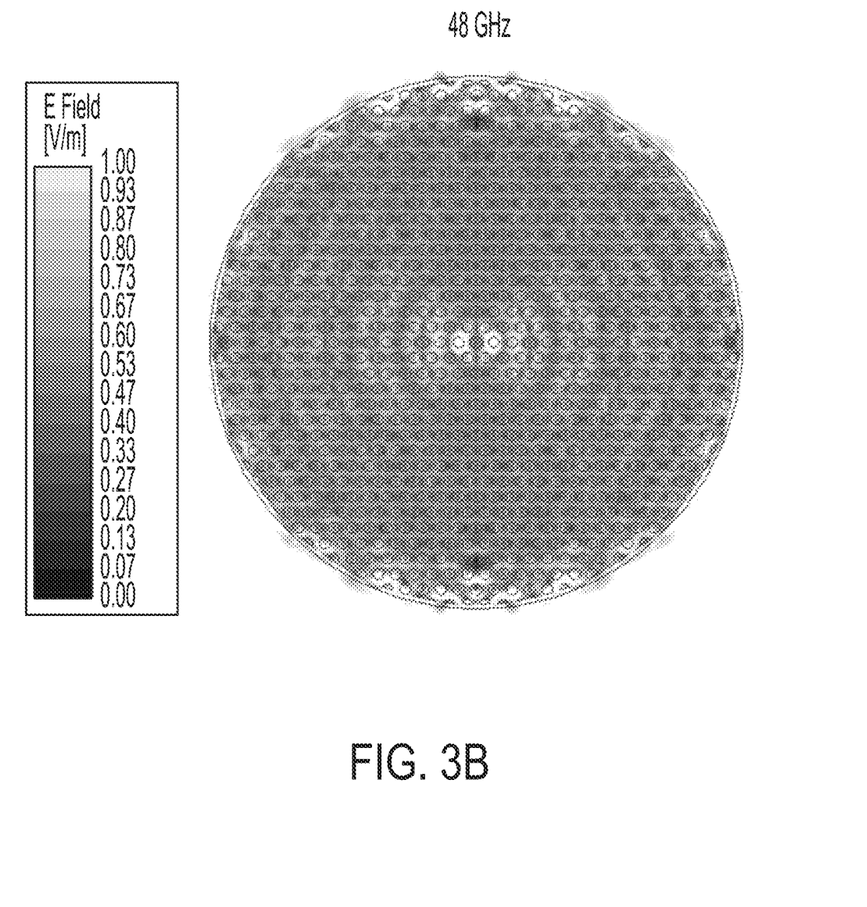
FIG. 3B is a contour graph of an electromagnetic field pattern in an example vapor cell after illumination with a plane wave of electromagnetic radiation at 48 GHz.
Figure 3C:
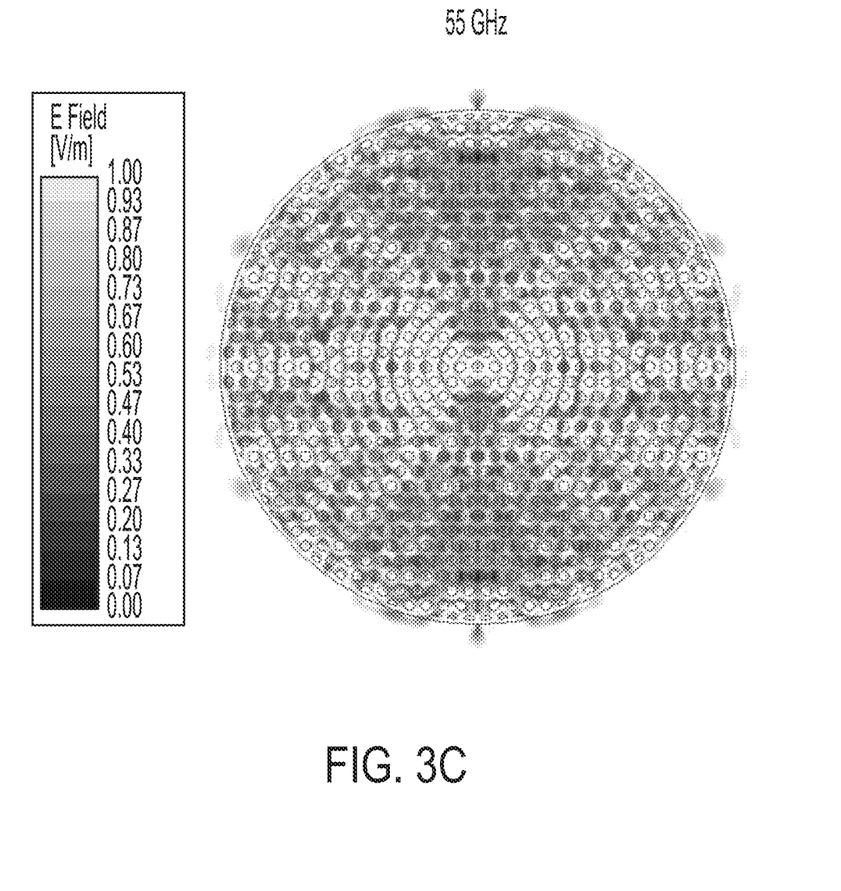
FIG. 3C is a contour graph of an electromagnetic field pattern in an example vapor cell after illumination with a plane wave of electromagnetic radiation at 55 GHz.

FIGS. 3A-3C present contour graphs of respective electromagnetic field patterns in an example vapor cell after illumination with a plane wave of electromagnetic radiation at 45 GHz, 48 GHz, and 55 GHz. The example vapor cell includes a photonic crystal frame, such as the one described in relation to FIGS. 2A-2B (or FIGS. 2C-2D). The 48 GHz plane wave falls within the photonic band gap of the vapor cell, and as such, the corresponding electromagnetic field pattern is relatively uniform across the vapor cell. In contrast, 45 GHz and 55 GHz plane waves fall outside of the photonic band gap and the corresponding electromagnetic field patterns are notably non-uniform.

In many implementations, the vapor cells include a photonic crystal frame, which is laser cut, etched, or machined (or any combination thereof) from silicon or glass. However, other materials are possible (e.g., sapphire). Laser cutting makes the manufacture of these vapor cells more amenable to mass production. In many variations, the optical window on one side of the vapor cell (e.g., top or bottom) includes a multilayer Bragg reflector optimized or otherwise configured for reflection of one or more of the optical signals (or beams of light) used to initialize and readout the atoms in the vapor cell. The Bragg reflector may correspond to a dielectric mirror and can be made of alternating layers of $SiO_2$ and $TiO_2$. However, other implementations are possible. In some variations, the last layer of the Bragg reflector is formed of SiO$_2$ or another oxide material (e.g., TiO$_2$) to facilitate contact bonding of the Bragg reflector to the frame.

If the Bragg reflector is not made of SiO$_2$, and instead, is made of another material, it is still possible to place an SiO$_2$ adhesion layer onto the surface of the Bragg reflector. The reflector needs to be dielectric and thin in order to reduce scattering of the incident field that is targeted for measurement. The optical window can be affixed to the frame using a bonding technique that can utilize high temperatures and/or high voltages such as anodic or glass frit bonding. If the frame is made of glass, a thin layer of Si can be deposited on the frame material as an adhesion layer for anodic bonding. It is also possible to contact bond the top optical window to the frame when both are formed from glass.

Another feature of the vapor cells is that, in at least some examples, the photonic crystal frame can provide support to the optical windows. This support resists, or may eliminate, the deflection of the optical windows due to atmospheric pressure. The motion of the optical windows can thus be minimized to allow for imaging of the light fields over the plane of the vapor cells. The optical windows are thin to reduce scattering of the field that is under test (FUT). This configuration allows for each ray of light passing through a region of the vapor cell to carry spatial information about the incident electromagnetic field (RF-mm-wave), i.e., the FUT. The spatial resolution of the optical imaging can, in some cases, determine the spatial resolution of the measurement of the incident electromagnetic field (FUT). The cavities in the photonic crystal frame of the vapor cells may have passages (e.g., small channels) fluidly connecting them so that all of the cavities are uniformly filled with vapor (e.g., Cs atomic vapor).

In some implementations, it may be possible to fill the vapor cell via a stem extending outward from vapor cell (e.g., a stem extending outward from a side of the vapor cell). The stem may correspond to a tubular structure that can be sealed, such as by fusing, after the vapor cell is filled. In some implementations, it may be optimal to fill the vapor cell through a small hole located in one of the optical windows or the side of the vapor cell. This small hole (or fill hole) can be contact bonded to seal the vapor cell. In this case the larger windows can be sealed using a high temperature and/or high voltage approach. The fill hole typically only needs to be large enough to out-gas the initial structure and, in most cases, allow for the filling of the vapor cell. In some variations, the fill hole is only required to be large enough to out-gas the vapor cell and enable it to be pumped down to the desired pressure. This latter method would be used if a chemically reactive method for filling can be implemented, e.g., getter source inside the vapor cell, another chemical release mechanism, or a thermally-activated method for the filling species.

The measurement of the power can be linked to properties of the atom through the transition dipole moments and fundamental constants. In some cases, using a vapor cell as described here, power can be measured to high precision in a controlled laboratory environment and the vapor cells may provide an absolute, self-calibrated measurement of the electromagnetic field. When measuring electromagnetic radiation from the DUT, the vapor cells may also provide absolute, self-calibrated measurement of the power emitted from the DUT, which along with a reference beam measurement, can be used to extract the phase of the electromagnetic radiation. The measurement can act as a standard for each DUT. Moreover, if the vapor cells are used in a holographic setup with the reference beam, the setup may provide a fully self-calibrated measurement since the reference wave power can be calibrated and stabilized with a Rydberg atom-based power sensor (or vapor cell) as a reference using a feedback loop. The geometry of the vapor cell can be known to 10 micron or less precision by laser cutting the vapor cell frame or etching the vapor cell structure. OTA testing is required by many different stake holders, including telecommunications carriers, electronics manufacturers, and regulatory bodies. OTA testing, which can be linked to standards, can assure compliance with governmental regulations and help to avoid costly design errors. Compliance and testing can help the high frequency electronics industry meet demanding global market schedules and technical specifications.

In some implementations, a method of manufacturing a vapor cell includes obtaining a dielectric body having a first surface and a second surface opposite the first surface. Obtaining the dielectric body may optionally include removing material from the dielectric body to form the first and second surfaces. The method also includes removing material from the dielectric body to form a plurality of cavities extending from the first surface to the second surface. The plurality of cavities are arranged periodically within the dielectric body to define a photonic crystal structure in the dielectric body. Each cavity has a first opening defined by the first surface and a second opening defined by the second surface. Moreover, the photonic crystal structure defines a photonic band gap. The method additionally includes bonding a surface of an optical window to the first surface of the dielectric body to form a seal around each of the first openings. The optical window covers the first openings of the plurality of cavities.

In some implementations, removing material from the dielectric body includes focusing a laser beam onto the dielectric body to machine material therefrom. In some implementations, removing material from the dielectric body includes exposing the dielectric body to a chemical to etch material therefrom. In some implementations, removing material from the dielectric body includes forming a passage through each wall separating the plurality of cavities. In these implementations, the passage fluidly couples adjacent cavities separated by the wall.

In some implementations, the vapor cell is configured to detect electromagnetic radiation within a target frequency range. In these implementations, the target frequency range is within or overlaps the photonic band gap. The photonic band gap may include a band gap associated with a transverse magnetic (TM) mode of the electromagnetic radiation. The photonic band gap may also include a band gap associated with a transverse electric (TE) mode of the electromagnetic radiation. In some variations, the photonic band gap includes a band gap associated with a transverse magnetic (TM) mode of the electromagnetic radiation and a band gap associated with a transverse electric (TE) mode of the electromagnetic radiation (e.g., a hybrid mode).

In some implementations, the method includes, before bonding, disposing a vapor or a source of the vapor into each of the plurality of cavities. In these implementations, bonding the surface of the optical window includes enclosing the vapor or the source of the vapor in each of the plurality of cavities.

In some implementations, removing material from the dielectric body comprises forming a hole through a perimeter wall of the dielectric body to at least one of the plurality of cavities. In such implementations, the method includes flowing a vapor through the hole and occluding the hole to seal the vapor in the plurality of cavities. In further implementations, the method includes attaching a tube to the perimeter wall to extend a passage defined by the hole. Occluding the hole may then include closing the end of the tube to seal the vapor in the plurality of cavities.

In some implementations, the method includes forming a hole through the optical window. The hole is positioned to fluidly-couple at least one of the plurality of cavities to an exterior of the optical window when the surface of the optical window is bonded to the first surface of the dielectric body. The method also includes flowing a vapor through the hole and occluding the hole to seal the vapor in the plurality of cavities. In further implementations, the method includes attaching a tube to the optical window to extend a passage defined by the hole. Occluding the hole may then include closing the end of the tube to seal the vapor in the plurality of cavities.

In some implementations, the optical window is a first optical window. In these implementations, the method includes disposing a vapor or a source of the vapor into each of the plurality of cavities. The method also includes bonding a surface of a second optical window to the second surface of the dielectric body to form a seal around each of the second openings. The second optical window covers the second openings of the plurality of cavities to enclose the vapor or the source of the vapor in each of the plurality of cavities.

EXAMPLES

In some cases, methods of manufacturing vapor cells may be implemented according to the following examples. However, examples are for purposes of illustration only. Modifications, both to materials and methods, may be practiced without departing from the scope of the disclosure.

Example 1

A p-type silicon wafer polished on both sides was obtained with a <100> orientation. The silicon wafer had a diameter of 4-inches and was 500 µm thick with a surface roughness, $R_a$, no greater than 1 nm on each side. Electrical properties of the silicon wafer included a resistivity of $10^4$ Ω-cm. A glass wafer formed of borosilicate glass was also obtained from Schott. The glass wafer was a MEMpax wafer having a diameter of 4 inches and a thickness of 300 µm. The surface roughness was less than 0.5 nm.

The silicon and glass wafers were inspected in preparation for anodic and contact bonding. In particular, the wafers were visually inspected for chips, micro-cracks, and scratches. The wafers were also verified to have a surface roughness less than 1 nm. A 500-nm protective layer of $SiO_2$ was grown on both sides of the silicon wafer using a wet growth process in an oxidation furnace. The temperature of the oxidation furnace was set to about 1100° C. and the processing time of the silicon wafer was about 40 min. A thickness uniformity of the silicon wafer (with the $SiO_2$ layers) was verified to be within 500±6 nm over its 4-inch diameter area. The surface roughness was also verified to be less than 1 nm.

The silicon wafer was formed into a silicon frame using either a Protolaser U4 micro-laser tool or Protolaser R micro-laser tool to machine material from the silicon wafer. The silicon frame included a plurality of cavities, each defined by a clover leaf shape with three lobes. The plurality of cavities was arranged periodically across the silicon frame. Notches were formed into walls of the silicon frame to define passages between the plurality of cavities. The silicon frame was inspected visually with 5× and 10× magnification loupes for cracks or chips that might have occurred during machining. If the silicon frame had zero or minimal surface defects, the frame was selected for subsequent vapor-cell fabrication.

The silicon frame was then cleaned with methanol and isopropanol using cotton swabs and optical tissue paper. Next, the silicon frame was submerged in a buffered oxide etch (BOE) solution having a 10:1 volume ratio and an etch rate of 55 nm/min at room temperature. The buffered oxide etch solution contained hydrofluoric acid buffered with ammonium fluoride. The silicon frame was submerged for at least 11 minutes to remove the 500-nm protective layer of $SiO_2$ from the surface of each side of the silicon frame. After being removed from the buffered oxide etch, the silicon frame was visually inspected. If embedded material from the machining process was found on a silicon frame, the silicon frame was discarded. If regions of $SiO_2$ remained on the silicon frame, the silicon frame was re-submerged in the buffered oxide etch solution, removed, and then re-inspected. If both sides of the silicon frame were free of the 500-nm protective layer of $SiO_2$, the silicon frame was selected for final cleaning.

The silicon frame was then cleaned with acetone and isopropanol using cotton swabs and optical tissue paper. An ultrasonic cleaner was optionally used to assist the cleaning process by agitating baths of acetone or isopropanol in which the silicon frame was submerged. A 100-nm layer of $SiO_2$ was then sputtered on one side of the silicon frame. The temperature of the sample was set to 600° C. in order to sputter a 100-nm layer of $SiO_2$ with a surface roughness of no greater than 1 nm. A thickness uniformity of the 100-nm $SiO_2$ layer was verified to be within 100±6 nm over an area of a silicon frame. If the silicon frame failed this uniformity criterion, the silicon frame was discarded.

The silicon frame with the 100-nm $SiO_2$ layer was then cleaned with methanol and isopropanol using cotton swabs and optical tissue paper to eliminate loose residues on its surfaces (e.g., such as due to handling). The silicon frame was subsequently deep-cleaned with acetone and isopropanol using cotton swabs and optical tissue paper. A low magnification loupe (e.g., 10×) was used during the deep cleaning process for a first visual inspection followed by a high magnification microscope (e.g., 50×-200×) for a second visual inspection. If the silicon frame passed the second vision inspection, the silicon frame was placed in a bath of acetone for ultrasonic cleaning at 40 kHz (e.g., in a Branson Ultrasonic Cleaner CPX-952-117R). For example, the silicon frame could be placed in a glass beaker of acetone and cleaned ultrasonically for 20 minutes at room temperature. After ultrasonic cleaning, the silicon frame was dried with particulate-free compressed air and stored in an air-tight container until needed for bonding.

Separately, the glass wafers were cleaned with methanol and isopropanol using cotton swabs and optical tissue paper. If necessary, the glass wafers were placed in a glass beaker of acetone and ultrasonically cleaned form 20 minutes at room temperature. After ultrasonic cleaning, the glass wafers were dried with particulate-free compressed air and then stored in an air-tight container until needed for bonding.

One silicon frame and one glass wafer were then placed into an assembly for anodic bonding. For the silicon frame, the planar surface opposite the planar surface defined by the 100-nm layer of $SiO_2$ participated in the anodic bonding process. In the assembly, planar surfaces of silicon frame and the glass wafer were contacted to define an interface, and the interface was visually inspected to confirm that optical fringes were present. The silicon frame was then heated to a temperature of about 400° C. After this temperature was reached, 600V was applied across the silicon frame and glass wafer for about 15 minutes, which drove the formation of an anodic bond. The interface was inspected again to confirm the disappearance of the optical fringes, which indicated the anodic bond was complete. Next, the anodic bond was inspected for defects (e.g., bubbles, micro-cracks, unbonded areas, etc.). If 80% or more of an area around the cavities was free of defects, the anodic bond was then further inspected for open channels (e.g., from a hole to the environment, a hole to another hole, etc.). If an open channel was discovered, the anodically-bonded body was discarded as the anodic bond was not deemed leak-tight.

Bonded silicon and glass bodies with leak-tight anodic bonds were cleaned in acetone and methanol. During this cleaning process, the unbonded surface of the silicon frame was cleaned with acetone and methanol using cotton swabs and optical tissue paper to eliminate any residues (e.g., residues from a graphite plate of the assembly used to form the anodic bond). The unbonded surface of the silicon frame was then visually inspected to ensure defects (e.g., scratches, pitting, etc.) were not present that might compromise a soon-to-be formed contact bond. The anodically-bonded body was then individually cleaned. In particular, the anodically-bonded body was placed in a glass beaker of acetone and cleaned ultrasonically for 20 minutes at room temperature. After ultrasonic cleaning, the anodically-bonded body was dried with particulate-free compressed air. A low magnification loupe (e.g., 10×) was used for a first visual inspection of the anodically-bonded body, followed by a high magnification microscope (e.g., 50×-200×) for a second visual inspection. The first and second visual inspections were used to ensure no visual residues or deposits remained on the anodically-bonded body.

The anodically-bonded body—along with a second glass wafer—was then taken into a clean room environment (e.g., Class 1000 or better) for contact bonding. A planar surface defined by the 100-nm layer of $SiO_2$ on the silicon frame of the anodically-bonded body and a planar surface of the second glass wafer were wiped with optical paper and acetone to clean any macroscopic deposits or contaminants from them. The pair was then submerged in an acetone bath (e.g., acetone in a beaker) and cleaned via ultrasonic cleaning for 15 minutes. The pair was subsequently removed from the acetone bath, rinsed with isopropanol (e.g., submerged in an isopropanol bath), and blown dry with dry nitrogen gas.

The pair was then placed in a YES-CV200RFS plasma system and activated for 45 seconds using a nitrogen plasma. In particular, the planar surface defined by the 100-nm layer of $SiO_2$ on the silicon frame and the planar surface of the glass wafer were activated by the plasma. The RF-power of the plasma system was set at about 75 W, and the pressure inside was maintained at about 150 mTorr. Nitrogen gas introduced into the plasma system at a volume flow rate of about 20 sccm. After activation by the plasma, the pair was removed from the YES-CV200RFS plasma system and rinsed in de-ionized water for 5 minutes. The rinsing process served to hydroxylate the activated surfaces. In some variations, the rinsing process was conducted with a basic aqueous solution (e.g., an aqueous solution of ammonium hydroxide). Care was taken in handling the parts so as not to contaminate or contact the hydroxylated, activated surfaces together.

Next, the pair was transferred into a vacuum chamber, a sample of Cs encased in paraffin was inserted into the structure and the structure was mounted into a fixture having a "press finger". The fixture held the second glass wafer adjacent the silicon frame of the anodically-bonded body to define a gap. The activated and hydroxylated surface of the glass wafer faced the activated and hydroxylated $SiO_2$ surface of the silicon frame. The vacuum chamber was then sealed and pumped down to a reduced pressure (e.g., less than $10^{-3}$ Torr).

Once the pair reached the target pressure, the fixture was actuated to contact the activated and hydroxylated surface of the glass wafer to the activated and hydroxylated $SiO_2$ surface of the silicon frame. The "press finger" was used to hold the contacted surfaces together for 20 minutes, which drove the formation of a contact bond. In some variations, the "press finger" was used to apply a target pressure (e.g., about 2 MPa) during the 20-minute duration. The fixture was removed from the chamber and the sample inside the fixture was annealed at 90 C in an oven to strengthen the bond.

Example 2

A thick glass wafer was obtained from Howard Glass Co., Inc. with a thickness of 1 mm and a diameter of 4 inches. The thick glass wafer had a surface roughness, $R_a$, no greater than 1 nm on each side. A thin glass wafer formed of borosilicate glass was also obtained from Schott. The thin glass wafer was a MEMpax wafer having a diameter of 4 inches and a thickness of 300 µm. The surface roughness was less than 0.5 nm. The thick and thin glass wafers were inspected in preparation for anodic and contact bonding. In particular, the glass wafers were visually inspected for chips, micro-cracks, and scratches. The wafers were also verified to have a surface roughness less than 1 nm.

A 100 µm Si wafer with a 500-nm layer of $SiO_2$ on a single side was anodically bonded to each side of the thick glass wafer such that the $SiO_2$ layers were exposed on the surface. The 100 µm Si wafer defined a layer of Si on the thick glass wafer. Alternatively, the layer of Si may be deposited on each side of the thick glass layer and the $SiO_2$ may be sputtered on the exposed surfaces. For example, a Si layer no greater than 1 µm thick may be deposited on both sides of the thick glass wafer using plasma-enhanced chemical vapor deposition (PECVD) and a 500-nm protective layer of $SiO_2$ may be sputtered onto each side of the stacked frame.

Next, a glass frame with the Si and $SiO_2$ layers was cut from the thick glass wafer using either a Protolaser U4 micro-laser tool or Protolaser R micro-laser tool to machine material from the glass wafer. The glass frame included a plurality of cavities, each defined by a clover leaf shape with three lobes. The plurality of cavities was arranged periodically across the silicon frame. Notches were formed into walls of the glass frame to define passages between the plurality of cavities. The glass frame was inspected visually with 5× and 10× magnification loupes for cracks or chips that might have occurred during machining. If the glass frame had zero or minimal surface defects, the frame was selected for subsequent vapor-cell fabrication.

The glass frame was then cleaned with methanol and isopropanol using cotton swabs and optical tissue paper. Next, the surfaces of the glass frame with the Si and $SiO_2$ layers was contacted with (e.g., submerged into) a buffered oxide etch (BOE) solution having a 10:1 volume ratio and an etch rate of 55 nm/min at room temperature. The buffered oxide etch solution contained hydrofluoric acid buffered with ammonium fluoride. The surface was contacted for at least 11 minutes to remove the 500-nm protective layer of $SiO_2$, thereby leaving the layers of Si on the glass frame.

After being removed from the buffered oxide etch, the glass frame was visually inspected. If embedded material from the machining process was found on a glass frame, the glass frame was discarded. If regions of $SiO_2$ remained on the glass frame, the glass frame was re-contacted with the buffered oxide etch solution, removed, and then re-inspected. If the surfaces of the glass frame were free of the 500-nm protective layers of $SiO_2$, the glass frame was selected for final cleaning.

The glass frame was then cleaned with acetone and isopropanol using cotton swabs and optical tissue paper. An ultrasonic cleaner was optionally used to assist the cleaning process by agitating baths of acetone or isopropanol in which the glass frame was submerged.

The glass frame was then cleaned with methanol and isopropanol using cotton swabs and optical tissue paper to eliminate loose residues on their surfaces (e.g., such as due to handling). The glass frame was subsequently deep-cleaned with acetone and isopropanol using cotton swabs and optical tissue paper. A low magnification loupe (e.g., 10×) was used during the deep cleaning process for a first visual inspection followed by a high magnification microscope (e.g., 50×-200×) for a second visual inspection. If the glass frame passed the second vision inspection, the glass frame was placed in a bath of acetone for ultrasonic cleaning at 40 kHz (e.g., in a Branson Ultrasonic Cleaner CPX-952-117R). For example, the glass frame could be placed in a glass beaker of acetone and ultrasonically cleaned for 20 minutes at room temperature. After ultrasonic cleaning, the glass frame was dried with particulate-free compressed air and stored in an air-tight container until needed for bonding.

A glass wafer was selected and a fill hole with a diameter of at least 3 mm (e.g., a fill hole for putting Cs into the vapor cell) was cut in the window using the Protolaser so as to align the hole with one of the clover leafed shaped holes in the glass frame. Separately, a second thin glass wafer and the wafer with the fill hole were cleaned with methanol and isopropanol using cotton swabs and optical tissue paper. If necessary, the thin glass windows were placed in a glass beaker of acetone and ultrasonically cleaned for 20 minutes at room temperature. After ultrasonic cleaning, the thin glass windows were dried with particulate-free compressed air and then stored in an air-tight container until needed for bonding.

The glass frame (with layers of Si) and one thin glass wafer were then placed into an assembly for anodic bonding. For the glass frame, one of the planar Si surfaces participated in the anodic bonding process. In the assembly, planar surfaces of the glass frame and the glass wafer were contacted to define an interface, and the interface was visually inspected to confirm that optical fringes were present. The glass wafer was then heated to a temperature of about 400° C. After this temperature was reached, 600V was applied across the contacted glass bodies for about 15 minutes, which drove the formation of an anodic bond. The interface was inspected again to confirm the disappearance of the optical fringes, which indicated the anodic bond was complete. Next, the anodic bond was inspected for defects (e.g., bubbles, micro-cracks, unbonded areas, etc.). If 80% or more of an area around the cavities was free of defects, the anodic bond was then further inspected for open channels (e.g., from a hole to the environment, a hole to another hole, etc.). If an open channel was discovered, the anodically-bonded body was discarded as the anodic bond was not deemed leak-tight. The same process was repeated for the other side of the glass frame, or structure, and the second optical window.

The anodically-bonded glass body was cleaned in acetone and methanol. During this cleaning process, the unbonded surface of the glass frame was cleaned with acetone and methanol using cotton swabs and optical tissue paper to eliminate any residues (e.g., residues from a graphite plate of the assembly used to form the anodic bond). The surface of the glass structure with the fill hole was then visually inspected to ensure defects (e.g., scratches, pitting, etc.) were not present that might compromise a soon-to-be formed contact bond. A low magnification loupe (e.g., 10×) was used for a first visual inspection of the anodically-bonded body, followed by a high magnification microscope (e.g., 50×-200×) for a second visual inspection. The first and second visual inspections were used to ensure no visual residues or deposits remained on the anodically-bonded body. A glass wafer, greater than or equal to 5 mm in square dimension, was similarly cleaned to prepare it for sealing the fill hole using a contact bond.

The anodically-bonded body—along with the glass piece cut to seal the fill hole—were then taken into a clean room environment (e.g., Class 1000 or better) for contact bonding. For the pair, the planar surface of the bonded structure with the fill hole and the planar surface of the glass piece for sealing the fill hole were wiped with optical paper and acetone to clean any macroscopic deposits or contaminants from them. The pair was subsequently removed from the acetone bath, rinsed with isopropanol, and blown dry with dry nitrogen gas. The process was repeated until both surfaces were visually clean using an optical loop.

The bonded structure and windows were then placed in a YES-CV200RFS plasma system and cleaned for 45 seconds using a nitrogen plasma. In particular, the window with the fill hole and the planar glass cover of the glass structure were activated by the plasma. The RF-power of the plasma system was set at about 75 W, and the pressure inside was maintained at about 150 mTorr. Nitrogen gas introduced into the plasma system at a volume flow rate of about 20 sccm. After activation by plasma, the pair was removed from the YES-CV200RFS plasma system and rinsed in de-ionized water for 5 minutes. The bonded structure was carefully contacted with the de-ionized water so as to not to fill the cavity with water. The rinsing process served to hydroxylate the activated surfaces. In some variations, the rinsing process was conducted with a basic aqueous solution (e.g., an aqueous solution of ammonium hydroxide). Care was taken not to touch the two hydroxylated and activated surfaces together.

Next, the pair was transferred into a vacuum chamber, a Cs sample encased in paraffin was inserted into the cavity below the 3-mm fill hole and the structure was mounted into a fixture having a "press finger". The fixture held the glass hole cover adjacent the glass window of the anodically-bonded body to define a gap. The activated and hydroxylated surface of the glass hole cover faced the activated and hydroxylated surface of the glass frame. The vacuum chamber was then sealed and pumped down to a reduced pressure (e.g., less than $10^{-3}$ Torr) to remove volatile species (e.g., water vapor) that might react with a vapor of cesium atoms used to fill the cells of the anodically-bonded body.

Once the vacuum chamber reached the desired pressure, the fixture was actuated to contact the activated and hydroxylated surface of the glass hole cover to the activated and hydroxylated surface of the anodically bonded structure. The "press finger" was used to hold the contacted surfaces together for 20 minutes, which drove the formation of a contact bond. In some variations, the "press finger" was used to apply a target pressure (e.g., about 2 MPa) during the 20-minute duration. The fixture was removed from the chamber and the sample inside the fixture was annealed at 90° C. for 8 hours in an oven to strengthen the bond.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A vapor cell, comprising:
   a dielectric body comprising:
      a first surface,
      a second surface opposite the first surface, and
      a plurality of cavities extending from the first surface to the second surface and ordered periodically to define a photonic crystal structure in the dielectric body, each cavity having a first opening defined by the first surface and a second opening defined by the second surface, the photonic crystal structure having a photonic band gap;
   a vapor or a source of the vapor in each of the plurality of cavities;
   a first optical window covering the first openings and having a surface bonded to the first surface of the dielectric body to form a seal around each of the first openings; and
   a second optical window covering the second openings and having a surface bonded to the second surface of the dielectric body to form a seal around each of the second openings.

2. The vapor cell of claim 1,
   wherein the vapor cell is configured to detect a target electromagnetic radiation; and
   wherein each of the plurality of cavities has a maximum dimension no greater than a wavelength of the target electromagnetic radiation.

3. The vapor cell of claim 1,
   wherein the vapor cell is configured to detect a target electromagnetic radiation;
   wherein the photonic band gap is no less than a bandwidth of the target electromagnetic radiation.

4. The vapor cell of claim 1,
   wherein the vapor cell is configured to detect electromagnetic radiation within a target frequency range; and
   wherein the target frequency range is within or overlaps the photonic band gap.

5. The vapor cell of claim 4, wherein the photonic band gap comprises a band gap associated with a transverse magnetic (TM) mode of the electromagnetic radiation.

6. The vapor cell of claim 4, wherein the photonic band gap comprises a band gap associated with a transverse electric (TE) mode of the electromagnetic radiation.

7. The vapor cell of claim 1, wherein the first and second surfaces of the dielectric body are planar surfaces parallel to each other.

8. The vapor cell of claim 1, wherein the plurality of cavities is ordered according to a two-dimensional lattice.

9. The vapor cell of claim 1,
   wherein the plurality of cavities is ordered according to a two-dimensional lattice; and
   wherein the two-dimensional lattice comprises first lattice sites and second lattice sites, the first lattice sites associated with first cavities having an identical shape and size, the second lattice sites associated with defects of the photonic lattice.

10. The vapor cell of claim 9, wherein the defects comprise a second cavity larger in size than the first cavities.

11. The vapor cell of claim 9, wherein the defects comprise a second cavity smaller in size than the first cavities.

12. The vapor cell of claim 9, wherein the defects comprise a second cavity having a shape different than the first cavities.

13. The vapor cell of claim 1, wherein the dielectric body comprises:
   a passage disposed through each wall separating the plurality of cavities, the passage fluidly coupling adjacent cavities separated by the wall.

14. The vapor cell of claim 1, wherein the first optical window comprises a dielectric mirror.

15. The vapor cell of claim 14, wherein the dielectric mirror is disposed along the surface of the first optical window bonded to the first surface of the dielectric body.

16. The vapor cell of claim 1, wherein the second optical window comprises an anti-reflection coating.

* * * * *